(12) United States Patent  
West

(10) Patent No.: US 8,298,944 B1  
(45) Date of Patent: Oct. 30, 2012

(54) WARPAGE CONTROL FOR DIE WITH PROTRUDING TSV TIPS DURING THERMO-COMPRESSIVE BONDING

(75) Inventor: Jeffrey Alan West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 13/150,873

(22) Filed: Jun. 1, 2011

(51) Int. Cl.
- *H01L 21/44* (2006.01)
- *H01L 29/40* (2006.01)
- *H01L 23/52* (2006.01)
- *H01L 21/768* (2006.01)
- *H01L 23/538* (2006.01)

(52) U.S. Cl. . 438/667; 257/621; 257/774; 257/E21.597; 257/E23.174

(58) Field of Classification Search ............... 438/667; 257/621, 774, E21.597, E23.174  
See application file for complete search history.

(56) References Cited

U.S. PATENT DOCUMENTS

| | | | |
|---|---|---|---|
| 6,848,177 B2 * | 2/2005 | Swan et al. | 29/852 |
| 2009/0121348 A1 * | 5/2009 | Chang | 257/737 |
| 2009/0278244 A1 * | 11/2009 | Dunne et al. | 257/676 |
| 2010/0032808 A1 * | 2/2010 | Ding et al. | 257/621 |
| 2010/0072579 A1 * | 3/2010 | Thies et al. | 257/621 |
| 2010/0171226 A1 | 7/2010 | West et al. | |

* cited by examiner

*Primary Examiner* — Luan C Thai  
(74) *Attorney, Agent, or Firm* — Steven A. Shaw; W. James Brady; Frederick J. Telecky, Jr.

(57) ABSTRACT

A method of fabricating through silicon via (TSV) die includes depositing a first dielectric layer on a substrate that includes a plurality of TSV die. The TSV die have a topside including active circuitry, a bottomside, and a plurality of TSVs including an inner metal core that reaches from the topside to protruding TSV tips that extend out from the bottomside. The first dielectric layer covers the TSV tips. A portion of the first dielectric layer is removed to expose the TSV tips. At least one metal layer is deposited on the TSV tips to form metal caps on the TSV tips to provide metal capped TSV tips. A second dielectric layer is deposited on the bottomside of the substrate to cover the metal capped TSV tips. A portion of the second dielectric layer is removed to expose a portion of the metal capped TSV tips.

20 Claims, 4 Drawing Sheets

WARPAGE CONTROL FOR DIE WITH PROTRUDING TSV TIPS DURING THERMO-COMPRESSIVE BONDING

FIELD

Disclosed embodiments relate to electronic devices, and more particularly to assembly of integrated circuit (IC) die or a wafer comprising a plurality of die having protruding through substrate via tips to at least one workpiece, and electronic devices therefrom.

BACKGROUND

As known in the art, through-substrate vias (referred to herein as TSVs), which are commonly referred to as through-silicon vias in the case of silicon substrates, are vertical electrical connections that extend the full thickness of the IC die from one of the electrically conductive levels formed on the topside semiconductor surface of the IC die (e.g., contact level or one of the back end of the line (BEOL) metal interconnect levels) to its bottomside surface. Such IC die are referred to herein as "TSV die." The vertical electrical paths are significantly shortened relative to conventional wire bonding technology, generally leading to significantly faster device operation. In one arrangement, the TSVs terminate on the bottomside of the TSV die as protruding TSV tips, such as protruding a distance of 5 to 15 µm from the bottomside substrate (e.g., silicon) surface. To form the protruding tips, the TSV die are commonly thinned while in wafer form to expose the TSVs and to form the tips, such as to a die thickness of 25 to 100 µm, using a process generally including backgrinding. The TSV die can be bonded face-up or face-down, and can be bonded to from both of its sides to enable formation of stacked die devices.

In die areas having TSVs, there can be no active devices because TSVs extend the full thickness of the TSV die. TSVs on the TSV die are generally arranged in a plurality of separate TSV arrays that cover a relatively small percentage of the TSV die area, and thus TSVs collectively do not approach uniformly covering the area of the TSV die. The TSVs within the TSV arrays are typically regularly spaced having a fixed pitch. Regions beyond the TSV arrays, or TSV-free regions, result in an irregular bottomside topography caused by the protruding TSV tips being elevated, such as protruding 5 to 15 µms, relative to the TSV-free regions having a consistent lowest elevation.

The TSV tips may include a metal cap thereon, such as a cap including a nickel comprising layer, that can function as an inter-metallic compound (IMC) barrier to overlying Sn-based solder in the case of solder mediated joints to a workpiece (e.g., a package substrate or another die or a die stack) to avoid, or at least delay, the consumption of the inner metal core (e.g., copper) of the TSV from forming an IMC which can lead to cracking of the outer dielectric sleeve of the TSV, and resulting failures (e.g., leakage or shorts) on the TSV die. The metal cap can significantly increase the height of the protruding TSV tips relative to the TSV-free regions.

Thermo-compression (TC) bonding is a common IC assembly method that involves the use of pressure (e.g., 40 to 80 N/cm$^2$) applied by a bond head and a significant temperature (e.g., a temperature high enough to melt solder, such as 230 to 300° C.) to join two materials by interdiffusion across the boundary of the materials. The TC bonding process relies on pressure to push pillars or other bonding features on the topside surface of TSV die or a TSV wafer against opposing pads on a substrate, wafer or another die that are to be bonded, and to heat and melt the solder. During TC bonding of a thin (e.g., <100 µm thick) TSV die having bottomside TSV tips to a substrate (e.g., package substrate, die, or die stack) in which the topside of the TSV die is bonded to pads on a substrate, the TC bond head comes in direct contact with the protruding TSVs that protrude far above the surrounding TSV-free regions, effectively resulting in non-uniformly distributed pressure applied to the bonds formed on the topside of the die.

SUMMARY

Disclosed embodiments are based on several recognitions of happenings during TC bonding the topside (active side) of thin TSV die or thin TSV wafers (e.g., <100 µm thick) to a workpiece, where the TSV die or TSV wafers have TSV-free regions across the area on their bottomside. The TSV-free regions have a consistent lowest elevation relative to protruding metal capped TSV tips resulting in an irregular bottomside topography than can cause pick-up problems and substantially non-uniformly distributed pressure applied during subsequent bonding operations that can cause problems including die warpage, damage to brittle low-k dielectrics between the TSVs and the bonded frontside surface, and cracking of the TSV's dielectric sleeve where the TSV exits the die bottomside.

Regarding pick-up problems, the exposed TSVs on the bottomside of the TSV die or TSV wafer can be damaged during vacuum pick-up, which can lead to poor bond integrity during subsequent bonding of the TSV tip to another workpiece. Moreover, thin TSV die and thin TSV wafers can easily bend when subjected to non-uniformly distributed pressure during TC bonding. This can lead to intra-die warpage post-bonding that induces non-uniform tensile stresses on the topside bonds which has been found by the Inventor to cause low bond yield to a workpiece, such as an organic substrate, and can also result in degradation of the "co-planarity" of the protruding TSVs that can create problems for subsequent bonding of the collective TSV tips to a workpiece with a nominally co-planar bonding surface.

Disclosed embodiments solve the above-described warpage problem by adding at least one dielectric layer that is referred to herein as a "planarizing layer" that reduces the maximum metal capped TSV tip protrusion offset relative to the die bottomside in the TSV-free regions. Such a planarizing dielectric layer provides a more uniform contact area of the TC bond head to the bottomside of the TSV die during TC bonding, which results in a more uniform pressure applied by the TC bond head during TC bonding, thus minimizing the opportunity for die warpage during TC bonding, thereby avoiding or significantly limiting opens in the bonded (topside) side of the TSV die. The planarizing dielectric layer need not be removed after TC bonding is complete since the metal capped TSV tips are exposed before TC bonding to a workpiece (e.g., an organic substrate). Since disclosed planarization layers are on the bottomside of the TSV die, no active die area is lost.

DETAILED DESCRIPTION

Figure 1A:
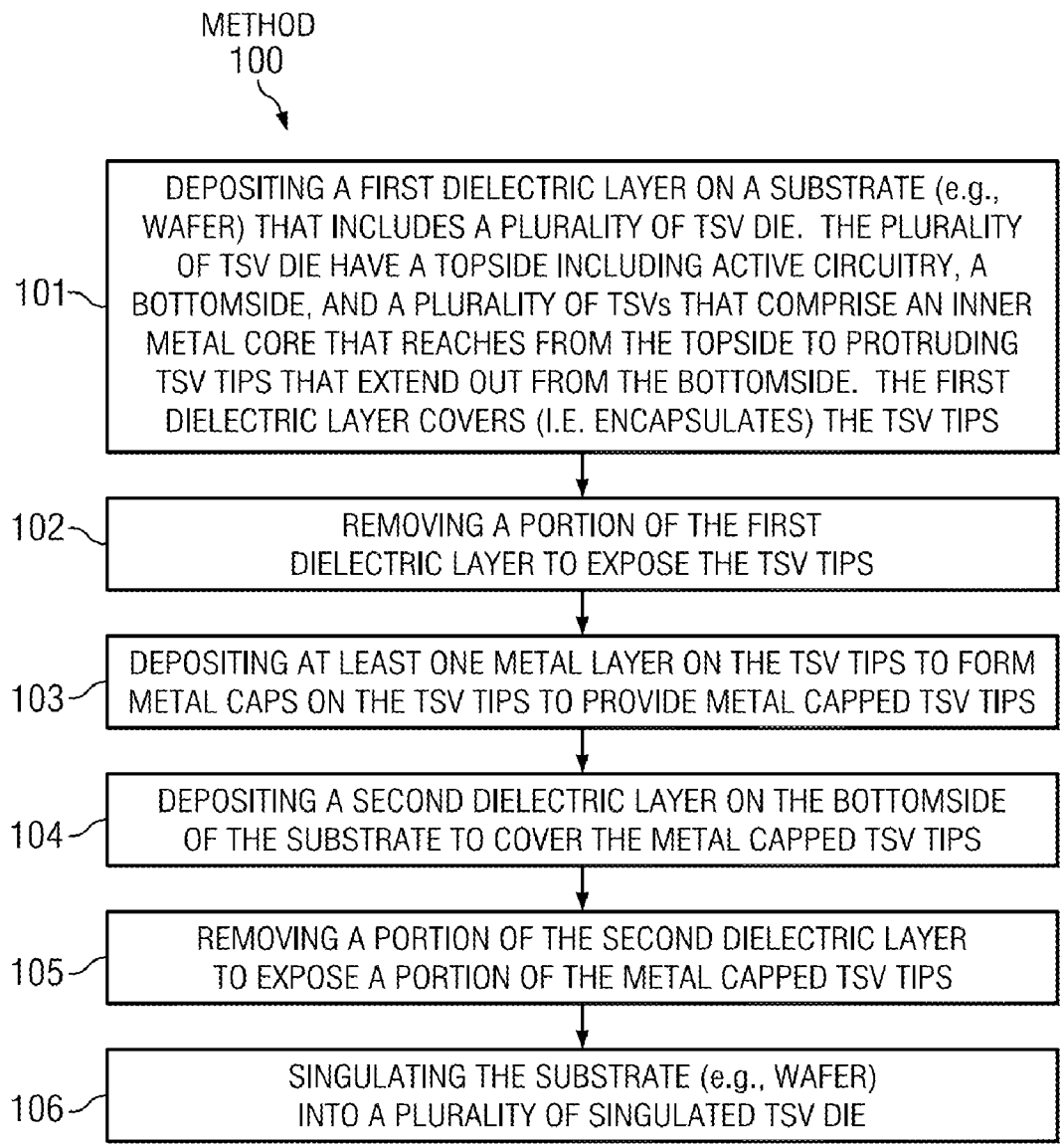
FIG. 1A is a flow chart that shows steps in an example method of fabricating TSV die, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a flow chart that shows steps in an example method 100 of fabricating a TSV die, according to an example embodiment. In method 100, the planarizing dielectric layer comprises a second dielectric layer on a first dielectric layer. Step 101 comprises depositing a first dielectric layer on a substrate (e.g., a wafer) including a plurality of TSV die, wherein the TSV die have a topside including active circuitry, a bottomside, and a plurality of TSVs comprising an inner metal core that reaches from the topside (generally coupled to the contact level or one of the back end of the line (BEOL) metal layers (e.g., M1, M2, etc.) to protruding TSV tips that extend out from the bottomside. The first dielectric layer covers (i.e., encapsulates) the TSV tips.

In one embodiment the first dielectric layer is spun on to cover over (i.e., encapsulate) the top of existing topography, including over the TSV tips. The first dielectric layer can planarize over protruding TSV tips. Some exemplary materials for the first dielectric layer (and optional second dielectric layer described below) include photosensitive precursor materials including precursors for benzocyclobutene (BCB), polybenzoxazole (PBO), and some polyimides (PI). The method can include optionally curing the first dielectric layer in the case of curable dielectric layer materials to increase the stiffness of the first dielectric layer.

In one embodiment a length of the protruding TSV tips measured from the bottomside of the TSV die is from 2 to 15 µm. In one embodiment the TSV diameter is <12 µm, such as 4 to 10 µm in one particular embodiment.

The inner metal core can comprise Cu in one embodiment. Other electrically conductive materials can be used for the inner metal core. The outer dielectric sleeve can comprise materials such as silicon oxide, silicon nitride, phosphorus-doped silicate glass (PSG), silicon oxynitride, or certain chemical vapor deposited (CVD) polymers (e.g., parylene). The outer dielectric sleeve is typically 0.2 µm to 5 µm thick.

In the case of copper and certain other metals for the inner metal core, a metal diffusion barrier layer referred to herein as a "TSV barrier" is generally added and is deposited on the dielectric sleeve, such as a refractory metal or a refractory metal nitride. For example, TSV barrier materials can include Ta, W, Mo, Ti, TiW, TiN, TaN, WN, TiSiN or TaSiN, which can be deposited by physical vapor deposition (PVD) or CVD. The TSV barrier is typically 100-500 Å thick.

Step 102 comprises removing a portion of the first dielectric layer to expose the TSV tips. Dry etching can be used for this step. Wet etch processing may also be suitable. Following step 102 the TSV tips may protrude above the height of the first dielectric layer by 1 to 3 µm.

Step 103 comprises depositing at least a first metal layer on the TSV tips to form metal caps on the TSV tips to provide metal capped TSV tips. Following step 103 the metal capped tips may extend above the height of the first dielectric layer lateral to the TSV tips by about 4 to 12 µm. The metal cap can comprise at least a first metal layer that includes a metal that is not in the inner metal core. The first metal layer can be exclusive of solder and can be electrolessly or electrolytically deposited (i.e., electroplating) on a distal portion of the protruding TSV tips. The first metal layer forms an electrical contact with at least the topmost surface of the inner metal core of the TSV tip.

The first metal layer can be generally 1 to 8 µm thick. The first metal layer can provide an IMC block. The first metal layer can comprise materials including Ni, Pd, Ti, Au, Co, Cr, Rh, NiP, NiB, CoWP or CoP, for example. In one specific embodiment, the first metal layer can comprise a 3 to 8 µm thick electroplated Cu plated layer. In one embodiment the inner metal core comprises copper and the TSV tips include a metal cap that includes at least one of Ti, Ni, Pd, and Au. An optional metal barrier layer may also be included between the first metal layer and the distal portion of the TSV tips. For example, a Ti or Ta comprising layer of about 1 kÅ to 3 kÅ may be used as a barrier layer.

The metal caps can include a second metal layer exclusive of solder that is different from the first metal layer on the first metal layer. The combined thickness of the first and second metal layers can be 1 µm to 10 µm. One metal cap arrangement comprises Ni/Au.

Step 104 comprises depositing a second dielectric layer on the bottomside of the substrate to cover (i.e. to encapsulate) the metal capped TSV tips. In one embodiment the second dielectric layer comprises the same material as the first dielectric layer. In one particular embodiment the depositing of the first dielectric layer and the depositing of the second dielectric layer both comprise a spin-on process, which may be cured subsequently (e.g., before or after step 105 described below).

Step 105 comprises removing a portion of the second dielectric layer to expose a portion of the metal capped TSV tips for subsequent bonding. Improved etch selectivity of the second dielectric layer relative to the first dielectric layer can be achieved by using a photosensitive second dielectric layer. Dry etching can be used for this step, including ashing. Wet etch processing (e.g., developing) may also be suitable. The etching process in step 105 need not be selective to the underfill (e.g., epoxy) because step 105 is performed before bonding the TSV die to a workpiece (e.g., a package substrate). Due to the presence of the second dielectric layer remaining after step 105, the metal capped tips may extend a height above that of the second dielectric layer lateral to the TSV tips by <3 µm, such as 0.5 µm to 2.5 µm.

Step 106 comprises singulating the substrate (e.g., wafer) into a plurality of singulated TSV die. Conventionally sawing techniques may be used.

Figure 1B:
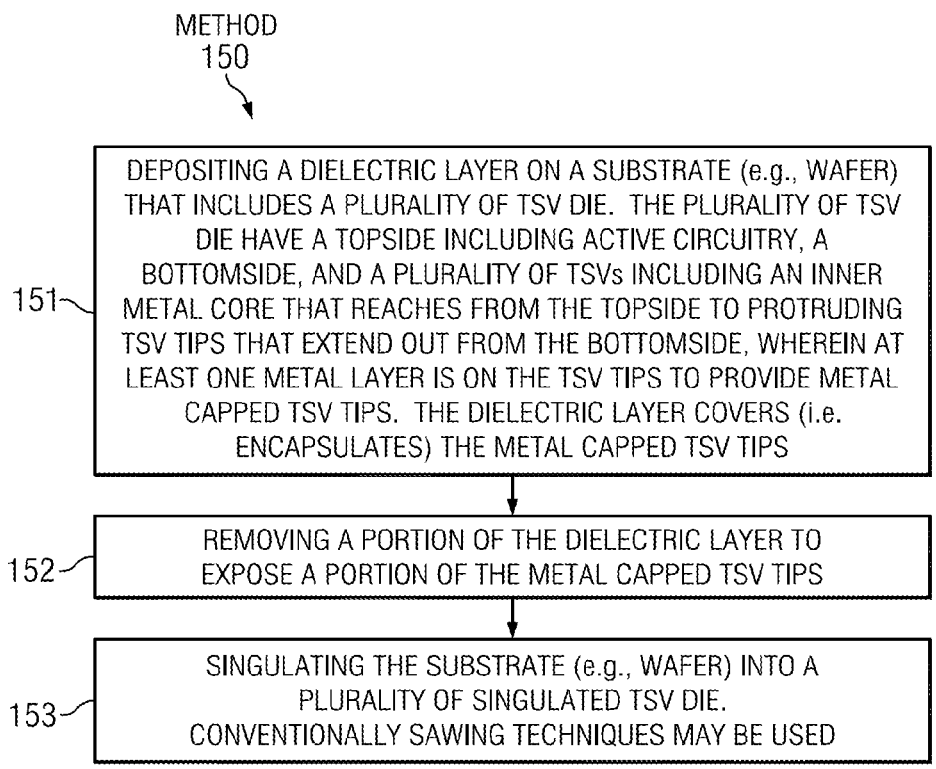
FIG. 1B is a flow chart that shows steps in an example method of fabricating TSV die, according to another example embodiment.

In one embodiment a planarization process after spin-on or other deposition of a single dielectric layer results in the metal capped TSV tips being exposed and substantially planar (i.e., within a maximum range of 1 µm) with the dielectric layer that is between the metal capped TSV tips. FIG. 1B is a flow chart that shows steps in an example method 150 of fabricating a TSV die, according to another example embodiment. Method 150 is a single planarizing dielectric layer variant of method 100 described above.

Step 151 comprises depositing a dielectric layer on a substrate (e.g., wafer) that includes a plurality of TSV die. The plurality of TSV die have a topside including active circuitry, a bottomside, and a plurality of TSVs including an inner metal core that reaches from the topside to protruding TSV tips that extend out from the bottomside, wherein at least one metal layer is on the TSV tips to provide metal capped TSV tips. The dielectric layer covers (i.e. encapsulates) the metal capped TSV tips. As described above, the dielectric layer may be cured after its deposition, either before or after step 152 described below.

Step 152 comprises removing a portion of the dielectric layer to expose a portion of the metal capped TSV tips. The removing can comprise chemical mechanical polishing (CMP). The CMP process can include a slurry and/or CMP conditions that provide a sufficiently high selectivity to allow removal and planarization of the dielectric layer without significant removal of the metal cap material, such as Au/Ni, once reached during polishing. Following step 152, the metal capped tips may extend above the height of the dielectric layer lateral to the TSV tips by <3 μm, such as 0.5 to 2.0 μm. Step 153 comprises singulating the substrate (e.g., wafer) into a plurality of singulated TSV die. Conventionally sawing techniques may be used for singulating.

Significantly, methods 100 and 150 are both generally applicable to any TC bonder apparatus as the disclosed planarizing dielectric layer(s) is applied to the TSV die and not to the bond head.

Figure 2:
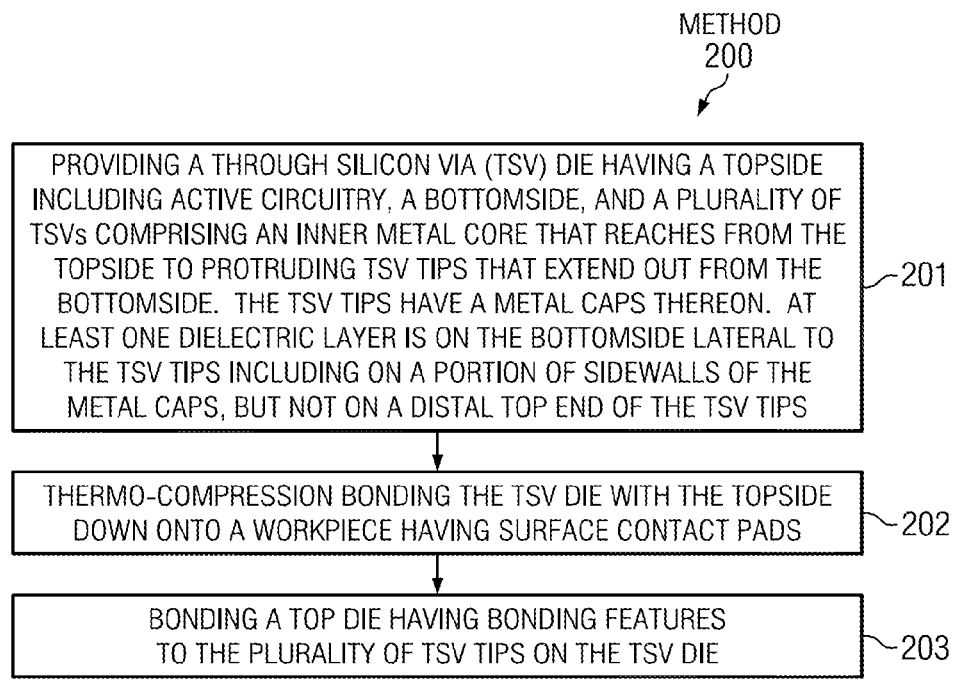
FIG. 2 is a flow chart that shows steps in an example method of semiconductor assembly, according to an example embodiment.

FIG. 2 is a flow chart that shows steps in an example method 200 of semiconductor assembly, according to an example embodiment. Step 201 comprises providing a TSV die having a topside including active circuitry, a bottomside, and a plurality of TSVs comprising an inner metal core that reaches from the topside to protruding TSV tips that extend out from the bottomside, wherein the TSV tips having metal caps thereon. There is at least one dielectric layer on the bottomside lateral to the TSV tips including on a portion of sidewalls of the metal caps, but not on a distal top end of the metal capped TSV tips.

Step 202 comprises thermo-compression bonding the TSV die with the topside down onto a workpiece having surface contact pads. The workpiece can be mounted to a carrier wafer during thermo-compression bonding. The workpiece can comprise an organic substrate in one embodiment, such as a substrate strip. The bonding can comprise TC bonding that can involve the use of pressure (e.g., 40 to 80 N/cm$^2$) applied by a bond head. As described above, the planarizing layer reducing the maximum tip protrusion offset (reducing topography) reduces gaps between the bottomside of the TSV die and the TC bond head which reduces pressure during TC bonding on the protruding TSV tips. Since the TSV tips are exposed (e.g., in wafer form) before TC bonding in step 202, there is no need to remove dielectric material over the metal capped TSV tips after step 202, which otherwise would risk damaging the underfill between the workpiece and the TSV die at its periphery.

Step 203 comprises bonding a top die having bonding features to the plurality of TSV tips on the TSV die. In one particular embodiment the top IC die comprises a memory die, and the TSV die comprises a logic (e.g., processor) die.

Figure 3:
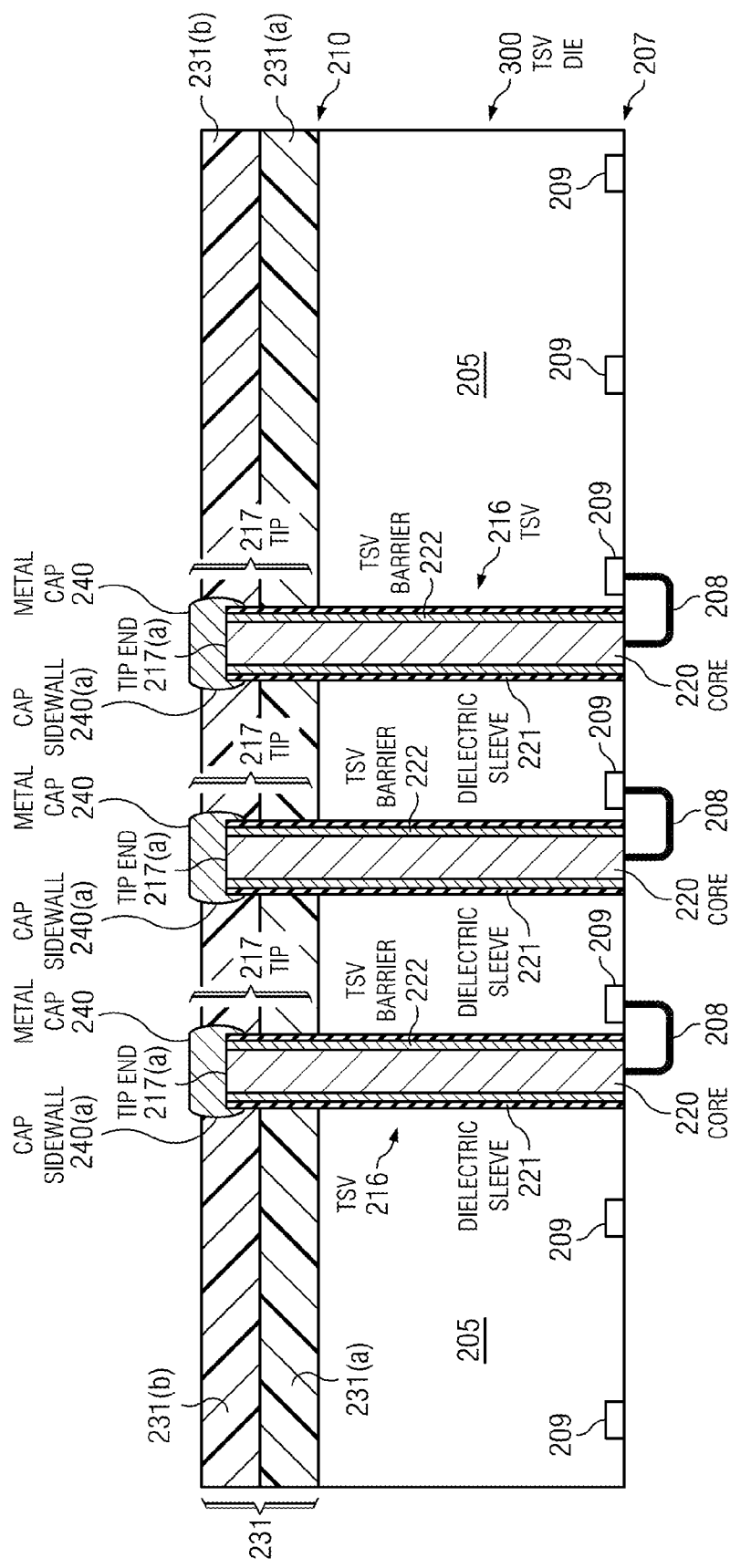
FIG. 3 is a simplified cross-sectional depiction of an example TSV die comprising a plurality of TSVs that include protruding TSV tips having a protective layer between and over the protruding TSV tips on the bottomside of the TSV die, according to an example embodiment.

FIG. 3 is a simplified cross-sectional depiction of an example TSV die 300 comprising a plurality of TSVs that include protruding TSV tips having a planarizing dielectric layer 231 comprising a second dielectric layer 231(b) on a first dielectric layer 231(a) between and over the protruding metal capped TSV tips on the bottomside of the TSV die, according to an example embodiment. TSV die 300 corresponds to the TSV die resulting from practice of method 100 which includes an interface between second dielectric layer 231(b) and the first dielectric layer 231(a). In contrast, TSV die resulting from practice of method 150 will have a single planarizing dielectric layer.

The TSV die 300 comprises a plurality of TSVs 216 that include protruding TSV tips 217 on the bottomside 210 of the TSV die 300. The protruding TSV tips 217 are shown having a metal cap 240 on their distal tip ends 217(a). The sidewall of the metal cap 240 is shown as 240(a).

TSV die 300 comprises a substrate 205 including a topside 207 including active circuitry 209 and a bottomside 210. The active circuitry 209 on TSV die 300 is configured to provide an IC circuit function, such as a logic function, for example. The connectors 208 shown depict the coupling between the TSVs 216 on the topside 207 of the TSV die 300 to the active circuitry 209 on the topside 207. The TSV connection to active circuitry 209 is optional, since the TSV may simply provide a through-die connection through the substrate 205 without connecting to active circuitry 209 (e.g., to a device attached to bottomside 210 of TSV die 300).

The TSV 216 comprise an outer dielectric sleeve 221 and an inner metal core 220, and a metal diffusion TSV barrier layer 222 between the outer dielectric sleeve 221 and the inner metal core 220. The TSVs 216 extends from the topside surface 207 to protruding TSV tip 217 emerging from the bottomside 210. The TSV tips 217 include sidewalls having outer dielectric sleeve 221 and barrier layer 222 thereon.

For example, in one particular embodiment the distal tip ends 217(a) of the TSVs 216 extend out about 5 μm from the bottomside surface 210 of TSV die 300, the metal caps 240 add about 5 μm in height to the TSV tips 217, and the planarizing dielectric layer 231 thickness is in the range from 7 to 9 μm with first dielectric layer 231(a) being about 3 μm thick, and second dielectric layer 231(b) being about 5 μm thick. In this particular embodiment, the metal caps 240 on the TSV tips 217 protrude from second dielectric layer 231(b) by about 2 μm.

Figure 4:
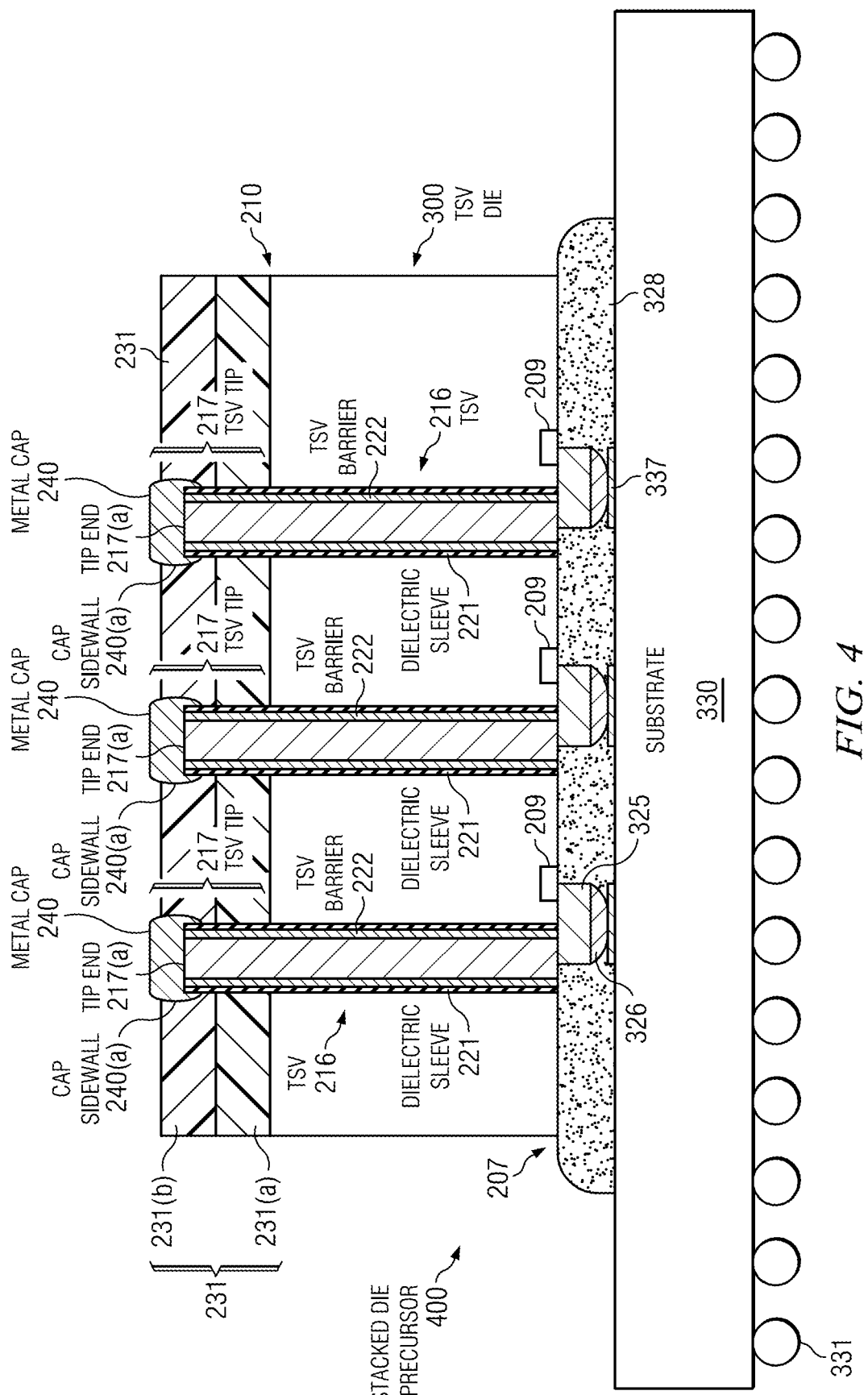
FIG. 4 shows an example stacked die precursor comprising the TSV die shown in FIG. 3 bonded to a workpiece, according to an example embodiment.

FIG. 4 shows an example stacked die precursor 400 comprising the TSV die 300 shown in FIG. 3 bonded to a workpiece 330, according to an example embodiment. TSV die 300 is bonded topside 207 down to contact pads 337 on a workpiece 330 that is shown as a package substrate (e.g., organic substrate). The package substrate can comprise a ceramic or an organic substrate that may be thin (e.g., <350 μm). The package substrate is generally provided as a substrate panel (or strip). The assembling can comprise TC bonding.

The TSV die 300 is shown including pillars 325 that are capped with solder 326. Underfill 328 is shown between the TSV die 300 and the substrate 330. The substrate 330 is shown including a ball grid array (BGA) comprising a plurality of solder balls 331.

The stacked die precursor 400 shown in FIG. 4 can be used to form a stacked die device (e.g., system package SIP) including TC bonding the stacked die precursor 400 to a workpiece. The planarizing dielectric layer 231 on the bottomside 210 of the TSV die 300 is etched back to expose the TSV tips 217 for subsequent bonding, or is completely removed. A top IC die can be assembled onto the exposed metal capped TSV tips of the TSV die 300. In one embodiment the top IC die comprises a memory die, and the TSV die comprises a logic die.

In another embodiment the top die comprises an IC die stack comprising a plurality of stacked IC die that are bonded to one another. As described above, the reduced warpage of the TSV die 300 following TC bonding provided by the protective layer described above can also reduce failures with top die assembly onto the protruding TSV tips due to loss of coplanarity. Overmolding can follow, and then singulation to form a plurality of stacked die devices. When the workpiece comprises a package substrate, method further comprises attaching ball grid array (BGA) solder balls to the bottom of the workpiece before singulation.

The active circuitry formed on the substrate having a semiconductor surface comprises circuit elements that may generally include transistors, diodes, capacitors, and resistors, as well as signal lines and other electrical conductors that interconnect the various circuit elements to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A method of fabricating through silicon via (TSV) die, comprising:
   depositing at least one dielectric layer on a substrate that includes a plurality of TSV die, said plurality of TSV die having a topside including active circuitry, a bottomside, and a plurality of TSVs including an inner metal core that reaches from said topside to protruding TSV tips that extend out from said bottomside, wherein at least one metal layer is on said TSV tips to form metal caps on said TSV tips to provide metal capped TSV tips, and wherein said dielectric layer covers said metal capped TSV tips, and
   removing a portion of said dielectric layer to expose a portion of said metal capped TSV tips.

2. The method of claim 1, wherein said removing comprises chemical mechanical polishing (CMP).

3. The method of claim 1,
   wherein said depositing at least one dielectric layer comprises depositing a first dielectric layer and depositing a second dielectric layer,
   wherein said first dielectric layer is deposited before forming said metal caps;
   wherein said removing comprises removing a portion of said first dielectric layer to expose said TSV tips;
   further comprising forming said metal caps to provide said metal capped TSV tips after said removing said portion of said first dielectric layer,
   wherein said depositing said second dielectric layer provides said second dielectric layer that covers said metal capped TSV tips, and
   and wherein said removing comprises removing a portion of said second dielectric layer to expose said portion of said metal capped TSV tips.

4. The method of claim 3, wherein said second dielectric layer comprises a polymer material that includes photosensitive precursor, wherein said polymer material is also used for said first dielectric layer.

5. The method of claim 4, wherein said polymer material comprises benzocyclobutene (BCB), polybenzoxazole (PBO), or a polyimide (PI).

6. The method of claim 3, wherein said depositing said first dielectric layer and said depositing said second dielectric layer both comprise a spin-on process, and at least one curing process subsequent to said spin-on processes.

7. The method of claim 1, further comprising singulating said substrate into a plurality of said TSV die after said removing.

8. The method of claim 1, wherein said removing comprises a dry etch.

9. The method of claim 1, wherein said removing comprises a wet etch.

10. The method of claim 1, wherein an offset in height between a top of said metal capped TSV tips and said dielectric layer lateral to said metal capped TSV tips is less than three (3) microns.

11. A method of fabricating through silicon via (TSV) die, comprising:
    depositing a first dielectric layer on a substrate that includes a plurality of TSV die, said plurality of TSV die having a topside including active circuitry, a bottomside, and a plurality of TSVs including an inner metal core that reaches from said topside to protruding TSV tips that extend out from said bottomside, wherein said first dielectric layer covers said TSV tips;
    removing a portion of said first dielectric layer to expose said TSV tips;
    depositing at least one metal layer on said TSV tips to form metal caps on said TSV tips to provide metal capped TSV tips;
    depositing a second dielectric layer on said bottomside of said substrate to cover said metal capped TSV tips, and
    removing a portion of said second dielectric layer to expose a portion of said metal capped TSV tips.

12. A method of semiconductor assembly, comprising:
    providing a through silicon via (TSV) die having a topside including active circuitry, a bottomside, and a plurality of TSVs comprising an inner metal core that reaches from said topside to protruding TSV tips that extend out from said bottomside, said TSV tips having metal caps thereon to provide metal capped TSV tips, and at least one dielectric layer on said bottomside lateral to said metal capped TSV tips including on a portion of sidewalls of said metal caps, but not on a distal top end of said metal capped TSV tips, and
    thermo-compression bonding said TSV die with said topside down onto a workpiece having surface contact pads.

13. The method of claim 12, wherein said workpiece comprises an organic substrate.

14. The method of claim 12, wherein said workpiece is mounted to a carrier wafer during said thermo-compression bonding.

15. The method of claim 12, further comprising:
    bonding a top die having bonding features to said plurality of metal capped TSV tips on said TSV die after said thermo-compression bonding.

16. A stacked die precursor, comprising:
a workpiece including a workpiece surface having a plurality of contact pads thereon;
a through substrate via (TSV) die including a substrate having a topside including active circuitry and bonding features on said topside, a bottomside, and a plurality of TSVs comprising a metal inner core that reaches from said topside to protruding TSV tips that extend out from said bottomside, and metal caps on said TSV tips to provide metal capped TSV tips, and
at least one dielectric layer on said bottomside of said TSV die that extends to cover only a portion of said metal caps so that a distal end of metal capped TSV tips is exposed,
wherein said bonding features of said TSV die are bonded to said plurality of contact pads on said workpiece surface.

17. The stacked die precursor of claim 16, wherein said workpiece comprises an organic substrate.

18. The stacked die precursor of claim 16, wherein said at least one dielectric layer comprises a first dielectric layer on a second dielectric layer.

19. The stacked die precursor of claim 16, wherein said first dielectric layer and said second dielectric layer both comprises benzocyclobutene (BCB), polybenzoxazole (PBO), or a polyimide (PI).

20. The stacked die precursor of claim 18, wherein an offset in height between a top of said metal capped TSV tips and said second dielectric layer lateral to said metal capped TSV tips is less than three (3) microns.

* * * * *